(12) United States Patent
Halliyal et al.

(10) Patent No.: US 7,074,677 B1
(45) Date of Patent: Jul. 11, 2006

(54) MEMORY WITH IMPROVED CHARGE-TRAPPING DIELECTRIC LAYER

(75) Inventors: Arvind Halliyal, Cuptertino, CA (US); Minh Van Ngo, Fremont, CA (US); Hidehiko Shiraiwa, San Jose, CA (US); Rinji Sugino, San Jose, CA (US)

(73) Assignee: FASL LLC, Sunnyvale, CA (US)

( * ) Notice: Subject to any disclaimer, the term of this patent is extended or adjusted under 35 U.S.C. 154(b) by 88 days.

(21) Appl. No.: 10/307,189

(22) Filed: Nov. 29, 2002

(51) Int. Cl.
*H01L 21/336* (2006.01)
(52) U.S. Cl. .................................... 438/261; 438/954
(58) Field of Classification Search ........ 438/257–267, 438/954
See application file for complete search history.

(56) References Cited

U.S. PATENT DOCUMENTS

| | | | | |
|---|---|---|---|---|
| 5,963,833 A | * | 10/1999 | Thakur | 438/677 |
| 6,136,728 A | * | 10/2000 | Wang | 438/773 |
| 6,248,628 B1 | * | 6/2001 | Halliyal et al. | 438/257 |
| 6,284,583 B1 | * | 9/2001 | Saida et al. | 438/216 |

* cited by examiner

*Primary Examiner*—Richard A. Booth
(74) *Attorney, Agent, or Firm*—Mikio Ishimaru

(57) ABSTRACT

A manufacturing method for a Flash memory includes depositing a first dielectric layer on a semiconductor substrate. A low hydrogen charge-trapping dielectric layer is deposited followed by a second dielectric layer. First and second bitlines are implanted and a wordline layer is deposited.

6 Claims, 4 Drawing Sheets

MEMORY WITH IMPROVED CHARGE-TRAPPING DIELECTRIC LAYER

BACKGROUND OF THE INVENTION

1. Technical Field

The present invention relates generally to semiconductor technology and data retention in semiconductor memories.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack electrical erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell, known as "MirrorBit®" Flash memory, has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been discovered that the charges, which represent bits of data, tend to drain away over time through the semiconductor device leading to poor data retention and poor performance of the flash device. The cause of this charge leakage was not fully understood.

A solution to this problem has been long sought but has long eluded those skilled in the art.

DISCLOSURE OF THE INVENTION

The present invention provides a manufacturing method for a Flash memory, which includes providing a semiconductor substrate and successively depositing a first insulating layer, a low hydrogen charge-trapping layer, and a second insulating layer. First and second bitlines are implanted and a wordlines are formed before completing the memory. The low hydrogen charge-trapping layer reduces charge loss and improves data retention. One of the reasons for charge leakage is that weakly bonded hydrogen in the region of the charge-trapping layer acts as a carrier for the electrical charge and causes the data retention capability to be diminished. The improved charge-trapping layer has a lower amount of weakly bonded hydrogen with subsequent reduction in charge loss.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
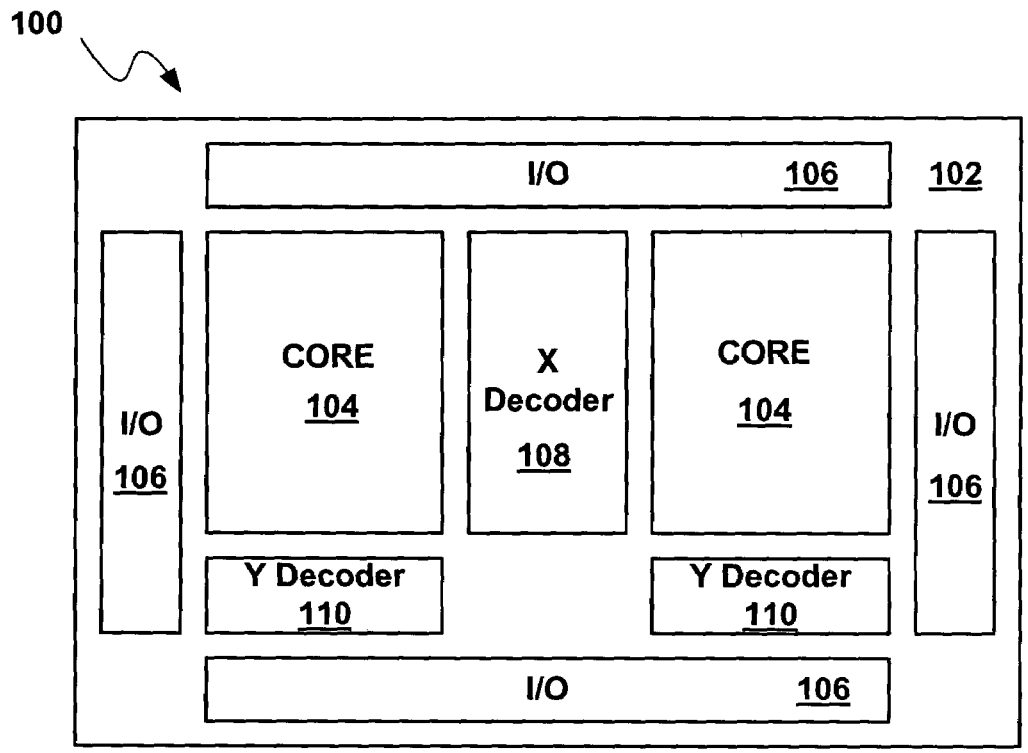
FIG. 1 is a plan view of a MirrorBit Flash EEPROM.

Referring now to FIG. 1, therein is shown a plan view of flash memory, such as a MirrorBit® Flash EEPROM 100, which includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
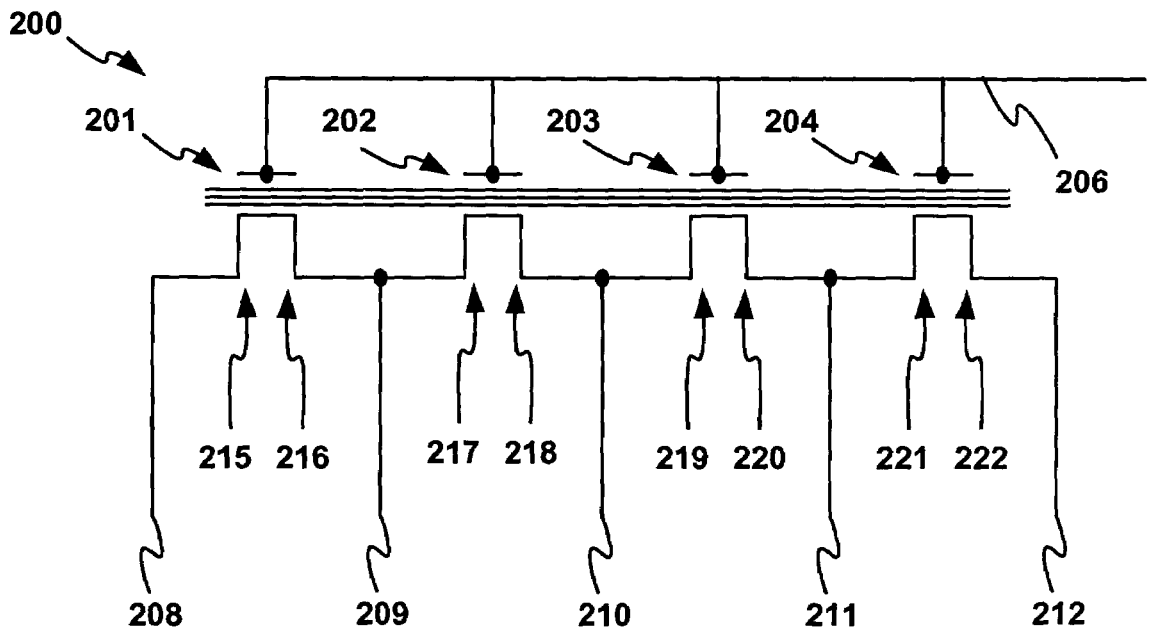
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
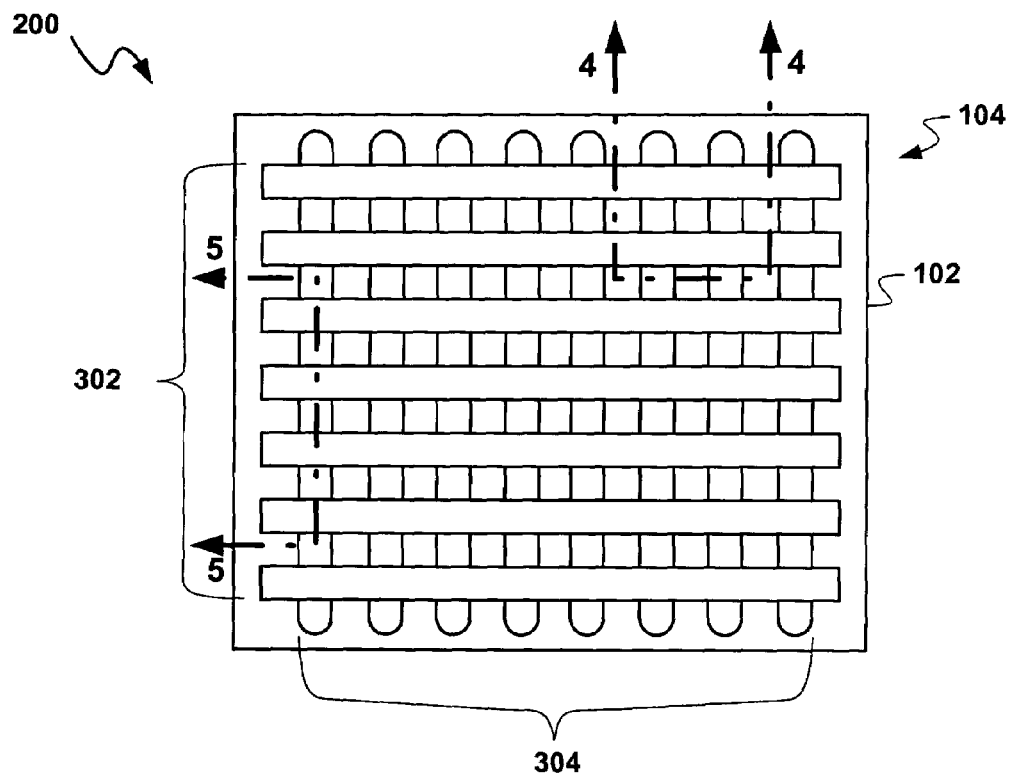
FIG. 3 is a plan view of a portion of one of the M×N array cores 104 of FIG. 1.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1.

Figure 4:
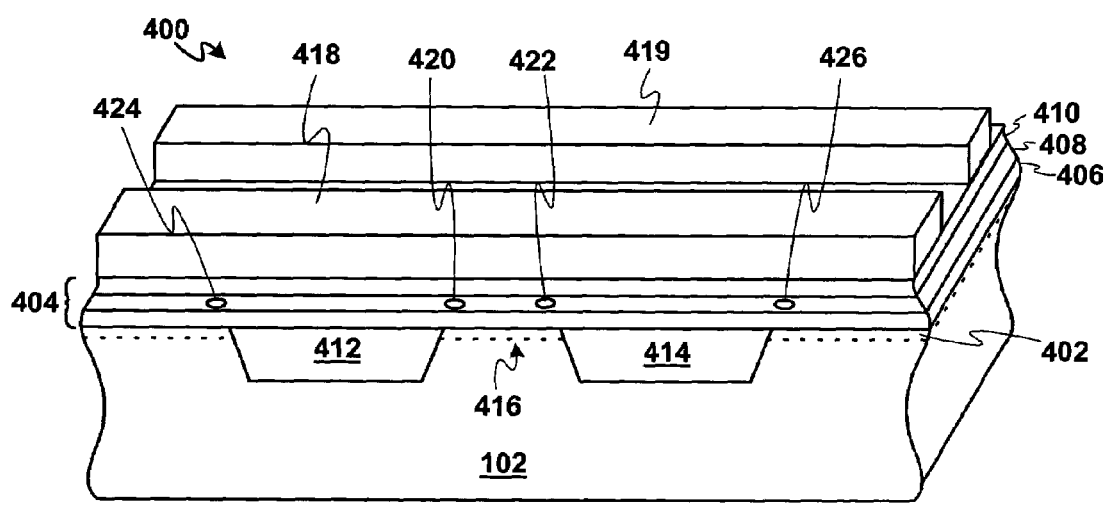
FIG. 4 is a cross-sectional isometric view of a typical MirrorBit Flash memory cell along the line 4—4 of FIG. 3.

Referring now to FIG. 4, therein is shown a cross-sectional isometric view of a typical, partially processed MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in wordlines 418 and 419 of FIG. 4. The wordlines 418 and 419 are two of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
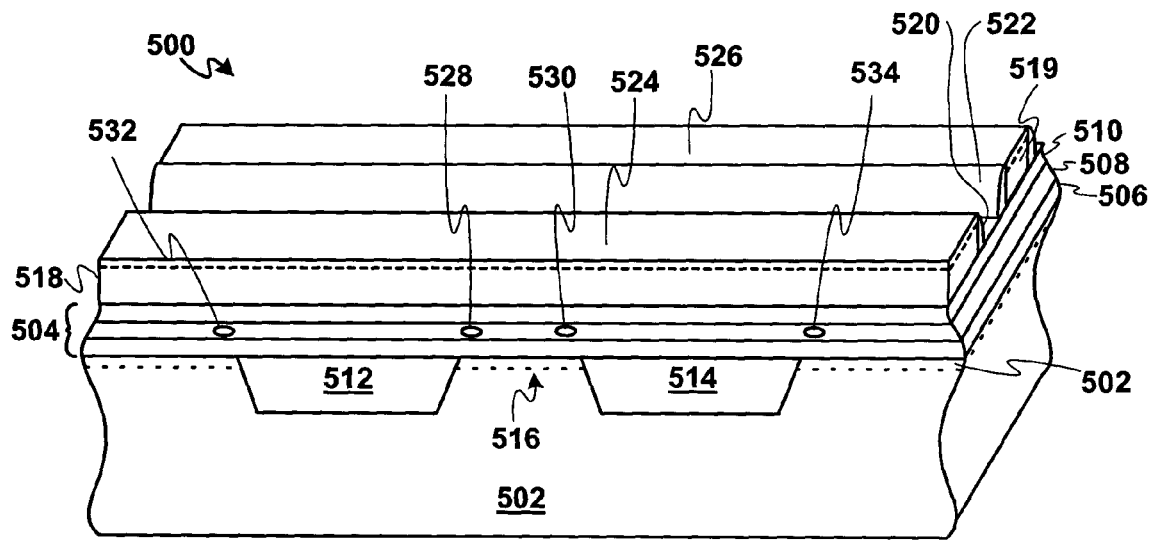
FIG. 5 is a cross-sectional view of a partially processed memory cell similar to a cross-sectional view along line 5—5 in FIG. 3 having a patterned photoresist and ARC material.

Referring now to FIG. 5, therein is shown a cross-sectional view of a partially processed memory cell similar to a cross-sectional view along line 5—5 in FIG. 3, such as a memory cell 500 according to the present invention. The semiconductor substrate 501 is a p-doped silicon substrate with a threshold adjustment implant 502 of a p-type material, such as boron. The threshold adjustment implant 502 provides a region that is more heavily doped than the semiconductor substrate 502 itself and assists in the control of the threshold voltage of the memory cell 500.

A charge-trapping dielectric layer 504 is deposited over the semiconductor substrate 501. The charge-trapping dielectric layer 504 generally can be composed of three separate layers: a first insulating layer 506 in contact with a charge-trapping layer 508, which is in contact with a second insulating layer 510. The first and second insulating layers 506 and 510 may be of an oxide dielectric such as silicon dioxide ($SiO_2$) and the charge-trapping layer 508 may be of a nitride dielectric such as silicon nitride ($Si_xN_y$) to form an ONO layer. It will be noted that the present invention is not limited to specific dielectric or charge-trapping materials.

The bitlines, as typified by n-type bitlines 512 and 514 in FIG. 5, are implanted under the charge-trapping dielectric layer 504 in the semiconductor substrate 501 and a wordline material 515, such as polysilicon, has been deposited over the charge-trapping dielectric layer 504. Again, it will be noted that the present invention is not limited to specific bitline or gate materials. For example, NPN structures are shown but the structures can also be PNP.

The wordline material 515 is patterned, etched, and stripped resulting in wordlines 518 and 519. Spacers 520 and 522 are then formed around the wordlines 518 and 519, respectively, and a salicide layer is deposited to form salicide areas 524 and 526, respectively, on the tops of the respective wordlines 518 and 519. The locations 528 and 530 indicate where bits can be stored in the memory cell 500 and locations 532 and 534 are adjacent locations, which are independent of the memory cell 500.

As explained briefly earlier, a major problem with the previous MirrorBit architecture is that the charges, which represent bits of data, tend to drain away over time through the semiconductor device leading to poor data retention. The mechanism of this charge loss is not fully understood.

It has been proposed that one of the reasons for the charge loss is that hydrogen in the region of the charge-trapping layer could act as a carrier for the electrical charge causing poor data retention. For example, where the charge-trapping layer includes a nitride layer, the hydrogen comes from depositing the nitride layer by reacting precursors, such as silane (SiH4) and ammonia (NH3) at about 700° C. to 900° C.

Figure 6:
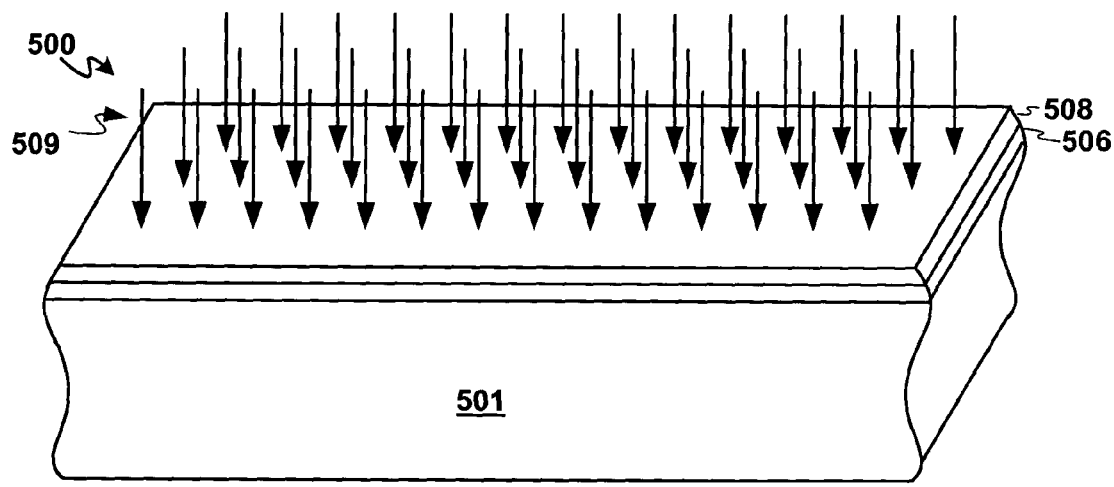
FIG. 6 is the structure of FIG. 5 prior to deposition of the charge-trapping dielectric layer.

Referring now to FIG. 6, therein is shown the structure of FIG. 5 prior to deposition of the charge-trapping dielectric layer 504. The first insulating layer 506 has been deposited and the improved charge-trapping layer 508 is in the process of being deposited in accordance with the present invention. The improved charge-trapping layer 508 has the characteristic of having reduced hydrogen by being deposited by an improved deposition process 509.

The hydrogen in a charge-trapping nitride layer occurs as either nitrogen-hydrogen (N—H) or silicon-hydrogen (Si—H) bonds. The bond strength of N—H is higher than the bond strength of Si—H bonds. A larger fraction of Si—H bonds in the nitride layer can cause more charge leakage. The term "low hydrogen" as used herein means reducing either the total amount of hydrogen in the nitride layer or reducing the amount of hydrogen occurring as Si—H bonds over the amounts produced by previous precursors. Thus an improved process for depositing nitride can mean reducing the fraction of weakly bonded Si—H bonds, which cause charge leakage.

In one embodiment, the charge-trapping layer 508 is a silicon nitride. The nitride layer is deposited by an LPCVD or RTCVD process by reacting precursors such as silane (SiH4) or dichlorosilane (SiH2Cl2) with ammonia (NH3) in the temperature range of 700° C. to 750° C. In this process, usually a small amount of hydrogen (1–4%) is incorporated in the nitride as N—H or Si—H bonds. The total amount of hydrogen or the fraction of Si—H bonds can be reduced by depositing the nitride with new precursors such as terachlorosilane (SiCl4) or by depositing the nitride at higher temperatures.

Examples of the low hydrogen deposition process 509, which can be used to deposit the nitride of the ONO layer include:

Low pressure chemical vapor deposition (LPCVD) reacting tetrachlorosilane (SiCl4) with ammonia.

Rapid thermal chemical vapor deposition (RTCVD) reacting tetrachlorosilane with ammonia.

Tetrachlorosilane nitride can be deposited in a batch type of furnace by LPCVD or in a single wafer deposition tool by RTCVD both in a temperature range from 650° C. to 850° C. In addition, any of the other precursors which combine to produce a low hydrogen deposition can be used.

Other examples of the low hydrogen deposition process 509, which can be used to deposit the nitride of the ONO layer with even less hydrogen or substantially zero hydrogen include:

LPCVD or RTCVD nitride at a high temperature from 800° C. to 850° C. without using silane (SiH4).

PECVD nitride deposition at a high temperature from 500° C. to 550° C. with an oxygen anneal at a higher temperature from 600° C. to 1000° C.

PECVD nitride using tetrachlorosilane and activated nitrogen.

After deposition of the improved charge-trapping layer 508 according to the present invention, the ability of the charge-trapping dielectric layer 504 to retain charges is greatly improved because of the lower amount of hydrogen or the reduction in the fraction of weakly bonded hydrogen occurring as Si—H. Thereafter, conventional processes and materials are used to complete the memory.

Figure 7:
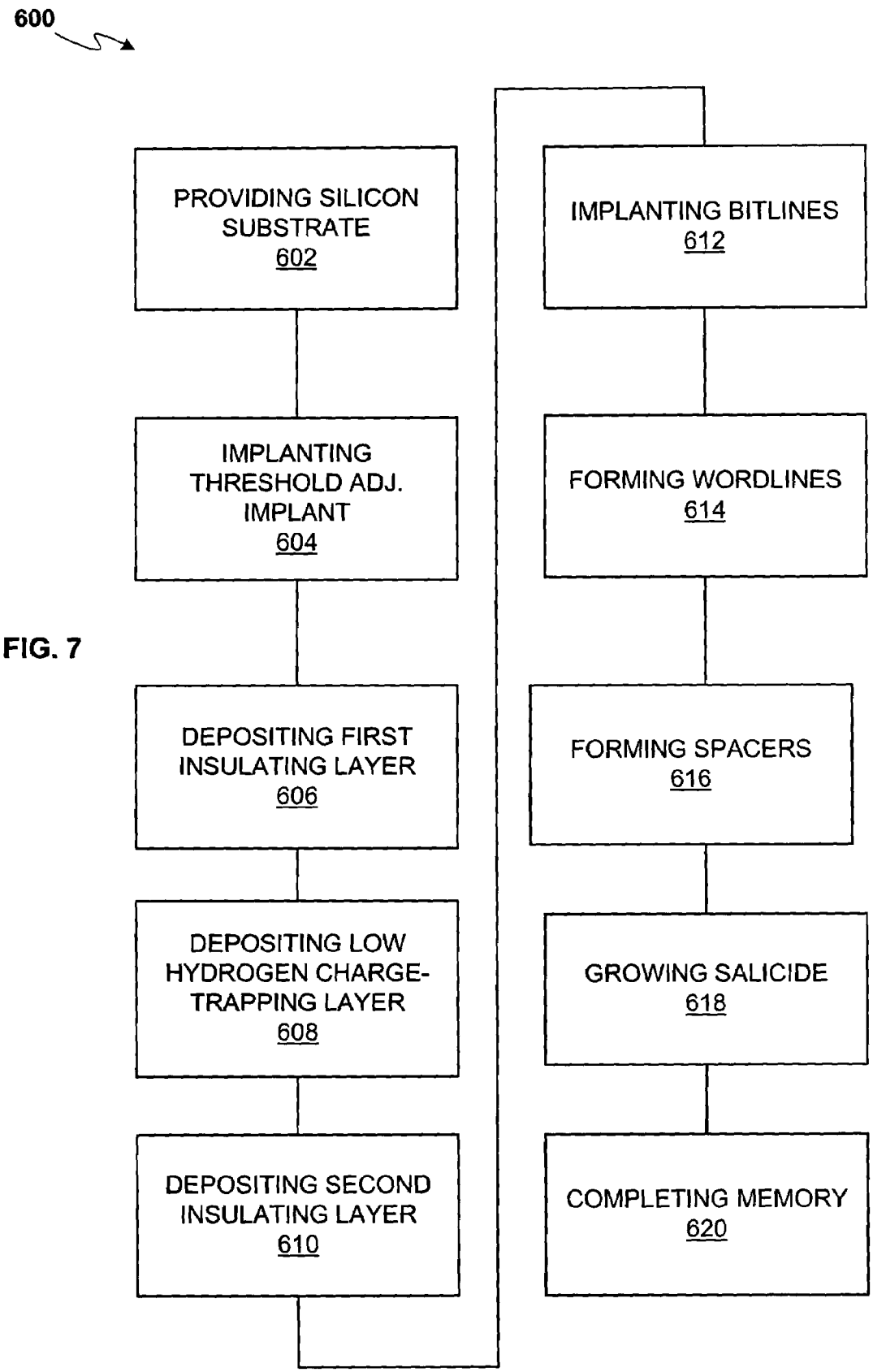
FIG. 7 is a simplified process chart according to the present invention.

Referring now to FIG. 7, therein is shown a simplified process chart 600 of the present invention which includes: providing semiconductor substrate 602; implanting threshold adjustment implant 604; depositing first insulating layer 606, depositing low hydrogen charge-trapping layer 608; depositing second insulating layer 610, implanting bitlines 612; forming wordlines 614; forming spacers 616, growing salicide 618, and completing memory device 620. Various alternative sequences, additions, and deletions to this process chart would be obvious to those skilled in the art from a detailed reading of the present disclosure.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

depositing a first dielectric layer on a semiconductor substrate;

depositing with an oxygen anneal a low hydrogen charge-trapping layer over the first dielectric layer for preventing charge loss;

a second dielectric layer over the charge-trapping layer;

forming first and second bitlines in the semiconductor substrate;

forming a wordline over the second dielectric layer; and completing the integrated circuit.

2. The method of manufacturing an integrated circuit as claimed in claim 1 wherein depositing the low hydrogen charge-trapping layer uses precursors that combine to produce a low hydrogen deposition.

3. The method of manufacturing an integrated circuit as claimed in claim 1 wherein depositing the low hydrogen charge-trapping layer deposits a nitride.

4. The method of manufacturing an integrated circuit as claimed in claim 1 wherein depositing the low hydrogen charge-trapping layer uses plasma enhanced chemical vapor deposition at a temperature above 500° C. without using ammonia.

5. The method of manufacturing an integrated circuit as claimed in claim 1 wherein depositing the low hydrogen charge-trapping layer uses a plasma enhanced chemical vapor deposition at temperature above 500° C. with an anneal at a temperature above 600° C.

6. The method of manufacturing an integrated circuit as claimed in claim 1 wherein depositing the low hydrogen charge-trapping layer deposits a nitride and depositing the first and second dielectric layers deposits oxides.

* * * * *

UNITED STATES PATENT AND TRADEMARK OFFICE
CERTIFICATE OF CORRECTION

PATENT NO. : 7,074,677 B1
APPLICATION NO. : 10/307189
DATED : July 11, 2006
INVENTOR(S) : Halliyal et al.

It is certified that error appears in the above-identified patent and that said Letters Patent is hereby corrected as shown below:

Column 8, after claim 6 lines 11-65 insert therefor claims 7-12 as listed below:

7. A method of manufacturing an integrated circuit comprising:

providing a silicon substrate;

depositing a first dielectric layer in contact with the silicon substrate;

depositing with an oxygen anneal a low hydrogen charge-trapping layer in contact with the first dielectric layer for preventing charge loss;

a second dielectric layer in contact with the charge-trapping layer;

forming first and second bitlines in the semiconductor substrate;

forming a wordline over the second dielectric layer; and completing the integrated circuit.

8. The method of manufacturing an integrated circuit as claimed in claim 7 wherein depositing the low hydrogen charge-trapping layer uses precursors which combine to produce a low hydrogen deposition.

9. The method of manufacturing an integrated circuit as claimed in claim 7 wherein depositing the low hydrogen charge-trapping layer deposits a nitride with nitrogen-hydrogen bonds and no silicon-hydrogen bonds.

10. The method of manufacturing an integrated circuit as claimed in claim 7 wherein depositing the low hydrogen charge-trapping layer uses plasma enhanced chemical vapor deposition at a temperature from 500°C to 600°C without using ammonia.

UNITED STATES PATENT AND TRADEMARK OFFICE
CERTIFICATE OF CORRECTION

PATENT NO. : 7,074,677 B1
APPLICATION NO. : 10/307189
DATED : July 11, 2006
INVENTOR(S) : Halliyal et al.

It is certified that error appears in the above-identified patent and that said Letters Patent is hereby corrected as shown below:

Column 8, after claim 6 lines 11-65 insert therefor claims 7-12 as listed below: (cont'd)

11. The method of manufacturing an integrated circuit as claimed in claim 7 wherein depositing the low hydrogen charge-trapping layer uses a plasma enhanced chemical vapor deposition at temperature from 500°C to 550°C with an oxygen anneal at a temperature from 600°C to 1000°C.

12. The method of manufacturing an integrated circuit as claimed in claim 7 wherein depositing the low hydrogen charge-trapping layer deposits a nitride and depositing the first and second dielectric layers deposits oxides.

Signed and Sealed this

Tenth Day of July, 2007

JON W. DUDAS
*Director of the United States Patent and Trademark Office*